United States Patent
Hu et al.

(10) Patent No.: US 12,401,354 B2
(45) Date of Patent: Aug. 26, 2025

(54) REFERENCE NOISE CANCELLATION DEVICE AND REFERENCE NOISE CANCELLATION METHOD FOR TRANSIENT ELECTROMAGNETIC FIELD

(71) Applicant: China University of Geosciences, Wuhan, Hubei (CN)

(72) Inventors: Xiangyun Hu, Hubei (CN); Lichao Liu, Hubei (CN); Hongzhu Cai, Hubei (CN); Yajun Liu, Hubei (CN); JianHui Li, Hubei (CN); Ri Wang, Hubei (CN)

(73) Assignee: China University of Geosciences, Wuhan, Hubei (CN)

( * ) Notice: Subject to any disclaimer, the term of this patent is extended or adjusted under 35 U.S.C. 154(b) by 50 days.

(21) Appl. No.: 18/602,043

(22) Filed: Mar. 12, 2024

(65) Prior Publication Data

US 2024/0421806 A1    Dec. 19, 2024

(30) Foreign Application Priority Data

Jun. 16, 2023    (CN) .......................... 202310713575.7

(51) Int. Cl.
*H03K 5/1252*    (2006.01)
(52) U.S. Cl.
CPC .................................. *H03K 5/1252* (2013.01)

(58) Field of Classification Search
CPC ....... H03K 5/1252; H04B 15/00; H04B 15/02
See application file for complete search history.

(56) References Cited

U.S. PATENT DOCUMENTS

2023/0083524 A1\* 3/2023 Collins ................ G01R 33/025
324/207.13

\* cited by examiner

*Primary Examiner* — Cassandra F Cox
(74) *Attorney, Agent, or Firm* — JCIPRNET

(57) ABSTRACT

A reference noise cancellation device for a transient electromagnetic field is provided. The device includes a transmitter, a transmitting loop, a reference coil, a signal coil and a receiver. The transmitter generates a measurement timing sequence to trigger the receiver to synchronously record the induction signal in the signal coil and the electromagnetic noise in the reference coil. A bipolar current waveform is generated and is injected into the transmitting loop through the first connecting line. The signal coil receives an induced magnetic field of an underground conductor and surrounding magnetic field noise. The reference coil receives surrounding electromagnetic noise. The receiver receives and records the induced magnetic field and surrounding electromagnetic noise of the underground conductor in the signal coil and the surrounding electromagnetic noise in the reference coil.

7 Claims, 6 Drawing Sheets

REFERENCE NOISE CANCELLATION DEVICE AND REFERENCE NOISE CANCELLATION METHOD FOR TRANSIENT ELECTROMAGNETIC FIELD

CROSS-REFERENCE TO RELATED APPLICATION

This application claims the priority benefit of China application serial no. 202310713575.7, filed on Jun. 16, 2023. The entirety of the above-mentioned patent application is hereby incorporated by reference herein and made a part of this specification.

BACKGROUND

Field of the Disclosure

The disclosure belongs to the technical field of electromagnetic noise suppression in geophysical exploration, and more specifically, relates to a reference noise cancellation device and technique in transient electromagnetic method.

Description of Related Art

Resistivity is a physical quantity that describes the electrical conductivity of a substance. Factors affecting earth resistivity include mineral composition, water content, and temperature. Conductivities of minerals vary significantly, with metallic minerals having a lower resistivity and non-metallic minerals having a higher resistivity. The resistivity of a mineral with a higher water content normally will be lower than the resistivity of the same mineral with a lower water content. Therefore, by measuring the resistivity of the subsurface, it is possible to analyze the composition of buried mineral and aquifers, thereby solving geological problems such as mineral exploration and groundwater investigation.

The transient electromagnetic field is a non-intrusive method for observing surface resistivity. Based on Faraday's law of electromagnetic induction, the transient electromagnetic field is performed by injecting current into the loop laid on the ground. After the current is stabilized, the current will be turned off suddenly. The fast changes in current will generate pulsed magnetic fields in the subsurface. When the geological bodies in the subsurface are stimulated by the pulsed magnetic field, they will generate induced currents, which in turn will generate induced magnetic fields. By using magnetic field sensors on the surface to receive the induced magnetic field intensity at different times, underground electrical parameter information at different depths can be obtained. The induced magnetic field generated by geological bodies with high conductivity is strong, and the induced current generated by geological bodies with low conductivity is weak. By analyzing the magnitude of the induced magnetic field observed by the transient electromagnetic field, the distribution of surface resistivity can be obtained. The unit of resistivity is ohm meter.

It can be seen from the above that the transient electromagnetic field obtains conductive information in the subsurface by observing the induced magnetic field of geological bodies. On the one hand, the induced current generated by underground conductors is weak, and the received induced magnetic field intensity is low, especially the late signal reflecting the results of deep geological bodies is weak. On the other hand, with the development of industrialization, electrification and informatization, the problem of electromagnetic noise interference generated has become increasingly serious. The above factors lead to a low signal-to-noise ratio of the data observed through the transient electromagnetic field that it is challenging accurately reflect the underground electrical structure information.

The majority of the existing technologies attempt to directly separate noise from signals recorded in the field. However, field observation data are characterized by uncertainty and non-steady state. Existing methods are not applicable and it is difficult to achieve optimal denoising performance.

SUMMARY OF THE DISCLOSURE

Considering the shortcomings of the existing technology, the purpose of the present disclosure is to provide a reference noise cancellation device and method for transient electromagnetic, aiming to solve the problem of poor denoising effect of the existing transient electromagnetic method.

In order to achieve the above purpose, the present disclosure provides a reference noise cancellation device for a transient electromagnetic field, including: a transmitter, a transmitting loop, a reference coil, a signal coil and a receiver.

One end of the transmitter is connected to the transmitting loop through a first connecting line, and the other end is connected to the receiver through a synchronization line. The reference coil is connected to the receiver through a third connecting line. The signal coil is connected to the receiver through a second connecting line. The signal coil is placed horizontally, and the reference coil is placed vertically. The signal coil and reference coil are located in the center of the transmitting loop.

The power supply is configured to supply power to the transmitter. The transmitter is configured to generate a measurement timing sequence to trigger the receiver to synchronously record the induction signal in the signal coil and the electromagnetic noise in the reference coil. A bipolar current waveform is generated and is injected into the transmitting loop through the first connecting line. The transmitting loop is configured to excite underground conductors to generate induced currents and induced magnetic fields. The signal coil is configured to receive the induced magnetic field of underground conductors and the surrounding magnetic field noise. The reference coil is configured to receive surrounding electromagnetic noise. The receiver is configured to receive and record the induced magnetic field and surrounding electromagnetic noise of the underground conductor in the signal coil and the surrounding electromagnetic noise in the reference coil. The magnitude of bipolar current is the supply voltage divided by the resistance of the transmitting loop.

Further preferably, the transmitter includes a timing sequence generator, a first switch, a second switch, a third switch, a fourth switch, a synchronization line, a first control line, a second control line, a third control line and a fourth control line.

The timing sequence generator is configured to generate a timing sequence control signal to control the on and off of the first switch, the second switch, the third switch and the fourth switch respectively through the first control line, the second control line, the third control line and the fourth control line, and use the synchronization line to trigger the receiver to record the signal coil and reference coil.

Further preferably, the receiver includes: a first amplifier, a second amplifier, a first filter, a second filter, a signal channel analog-to-digital converter, a reference channel analog-to-digital converter, a controller and a memory.

The output end of the first amplifier is connected to the input end of the first filter. The output end of the first filter is connected to the input end of the signal channel analog-to-digital converter. The output end of the signal channel analog-to-digital converter is connected to the controller. The output end of the second amplifier is connected to the input end of the second filter. The output end of the second filter is connected to the input end of the reference channel analog-to-digital converter. The output end of the reference channel analog-to-digital converter is connected to the controller. The output end of the controller is connected to the memory.

The first amplifier, the first filter and the signal channel analog-to-digital converter are constructed as a signal acquisition channel. The first amplifier is configured to increase the amplitude of the induced magnetic field signal of the underground conductor output by the signal coil and the surrounding electromagnetic noise. The first filter is configured to filter out high-frequency noise higher than the signal frequency from the signal transmitted by the first amplifier. The signal channel analog-to-digital converter is configured to digitally quantize the signal transmitted by the first amplifier that filters out high-frequency noise to obtain the first sampling value.

The second amplifier, the second filter and the reference channel analog-to-digital converter are constructed as the reference acquisition channel. The second amplifier is configured to increase the amplitude of the surrounding electromagnetic noise output by the signal coil. The second filter is configured to filter out high-frequency noise higher than the signal frequency from the surrounding electromagnetic noise with increased amplitude. The reference channel analog-to-digital converter is configured to digitally quantize the signal output by the second filter to obtain the second sampling value.

The controller is configured to read the first sampling value and the second sampling value, and store the first sampling value and the second sampling value in the memory.

Further preferably, a rotating bracket is configured to place the reference coil at an angle perpendicular to the ground. The rotating bracket includes a hemispherical base and a support rod. The hemispherical base is configured to increase the stability of the reference coil. The support rod is configured to allow the reference coil to rotate about the support rod.

Further preferably, the timing sequence generator generates the control signal A and the control signal B. The first control line and the fourth control line transmit the control signal A, and the second control line and the third control line transmit the control signal B.

During the period t1, when the control signal A is high level and the control signal B is low level, the first switch and the fourth switch are turned on, and the second switch and the third switch are turned off. The current in the power supply passes through the eighth connecting line, the fourth connecting line, the first connecting line and the seventeenth connecting line, and flows into the transmitting loop from left to right, and then flows back to the negative electrode of the power supply through the first control line, the sixth connecting line and the ninth connecting line, thereby generating a forward emission current.

During the period t2, when both control signal A and control signal B are low level, the first switch, the second switch, the third switch and the fourth switch are all turned off, and the current in the transmitting loop disappears. According to the law of electromagnetic induction, based on the horizontal layered earth resistivity model, the induced magnetic field signal is not generated in the horizontal direction, but an induced magnetic field signal is generated along the direction perpendicular to the ground.

During the period t3, when the control signal A is low level and control signal B is high level, the second switch and the third switch are turned on, the first switch and the fourth switch are turned off, and the current in the power supply passes through the eighth connecting line and the eighteenth connecting line, and flows into the transmitting loop from right to left, and flows back to the negative electrode of the power supply through the seventeenth connecting line, the seventh connecting line and the ninth connecting line, thereby generating a reverse emission current.

During the period t4, when the control signal A and the control signal B are both low levels, the first switch, the second switch, the third switch and the fourth switch are all turned off, and the current in the transmitting loop 3 disappears. According to the law of electromagnetic induction, based on the horizontal layered earth resistivity model, the induced magnetic field signal is not generated in the horizontal direction, and an induced magnetic field signal is generated along the direction perpendicular to the ground, but the direction of the induced magnetic field is opposite to the induced magnetic field signal generated in the period t2.

On the other hand, the present disclosure provides a reference noise cancellation method for a transient electromagnetic field, which includes the following steps:

D1: generating a forward emission current to generate the forward excitation magnetic field by turning on the first switch and the fourth switch;

D2: collecting the forward induced magnetic field signal of the underground conductor while completing the recording of the surrounding electromagnetic noise in the reference coil;

D3: using the reference noise cancellation algorithm to convert the surrounding electromagnetic field noise recorded by the reference channel into an estimate value of the electromagnetic noise of the signal channel, and subtracting the estimate value from the signal channel to obtain the forward induced magnetic field signal in the signal channel;

D4: generating a reverse excitation magnetic field by turning on the second switch and the third switch;

D5: collecting the reverse induced magnetic field signal of the underground conductor while completing the recording of the surrounding electromagnetic noise in the reference coil;

D6: using the reference noise cancellation algorithm to convert the surrounding electromagnetic noise recorded by the reference channel into an estimate value of the electromagnetic noise of the signal channel, and subtracting the estimate value from the signal channel to obtain the reverse induced magnetic field signal in the signal channel;

D7: subtracting the reverse induced magnetic field signal obtained in step D6 from the forward induced magnetic field signal obtained in step D3 to obtain the difference signal between the two to cancel the low-frequency drift noise;

D8: determining whether the number of iterations reaches the preset number of iterations, if not, repeating steps D1 to D7, otherwise performing step D9;

D9: superposing multiple difference signals obtained through loops to obtain the mean and variance of the difference signals.

Further preferably, the reference noise cancellation algorithm specifically includes the following steps:

The signal channel is adopted to collect the superposition value of the induced magnetic field of the underground conductor and the surrounding electromagnetic noise through the signal coil;

The reference channel is adopted to collect the surrounding electromagnetic noise through the reference coil;

An adaptive algorithm is adopted to convert the surrounding electromagnetic noise collected by the reference coil into an estimate value of the surrounding electromagnetic noise collected by the signal coil;

The estimate value of the surrounding electromagnetic noise collected by the signal coil is subtracted from the superposition value of the induced magnetic field of the underground conductor collected by the signal channel and the surrounding electromagnetic noise to obtain the denoised transient electromagnetic signal.

Generally speaking, compared with the related art, the above technical solution conceived by the present disclosure has the following advantageous effects.

The disclosure provides a reference noise cancellation device for a transient electromagnetic field and method, in which the signal coil is placed horizontally and the reference coil is placed vertically; a timing sequence generator is adopted to generate timing sequence control signals, and the signal coil is adopted to receive the induced magnetic field of the underground conductor and the surrounding magnetic field noise. The reference coil is adopted to receive the surrounding electromagnetic noise; the reference noise cancellation algorithm is adopted to convert the surrounding electromagnetic field noise recorded by the reference channel into an estimate value of the electromagnetic noise of the signal channel. The estimate value of the surrounding electromagnetic noise collected by the signal coil is subtracted from the superposition value of the induced magnetic field of the underground conductor collected by the signal channel and the surrounding electromagnetic noise to obtain the denoised transient electromagnetic signal. The above method may improve the anti-interference of transient electromagnetic field observation, which not only eliminates the influence of steady-state noise on transient electromagnetic measurements, but also removes unsteady-state noise from the observation channel, thereby improving data quality and detection accuracy of transient electromagnetic field. After the anti-interference of detection of the transient electromagnetic field is improved, the application scope of the method may be expanded to interference environments with strong noise, such as detection in urban underground spaces, advanced detection of water inrush in mines, etc.

DESCRIPTION OF EMBODIMENTS

In order to make the purpose, technical solutions and advantages of the present disclosure more clear, the present disclosure will be further described in detail below with reference to the accompanying drawings and embodiments. It should be understood that the specific embodiments described here are only used to explain the present disclosure and are not intended to limit the present disclosure.

Figure 1:
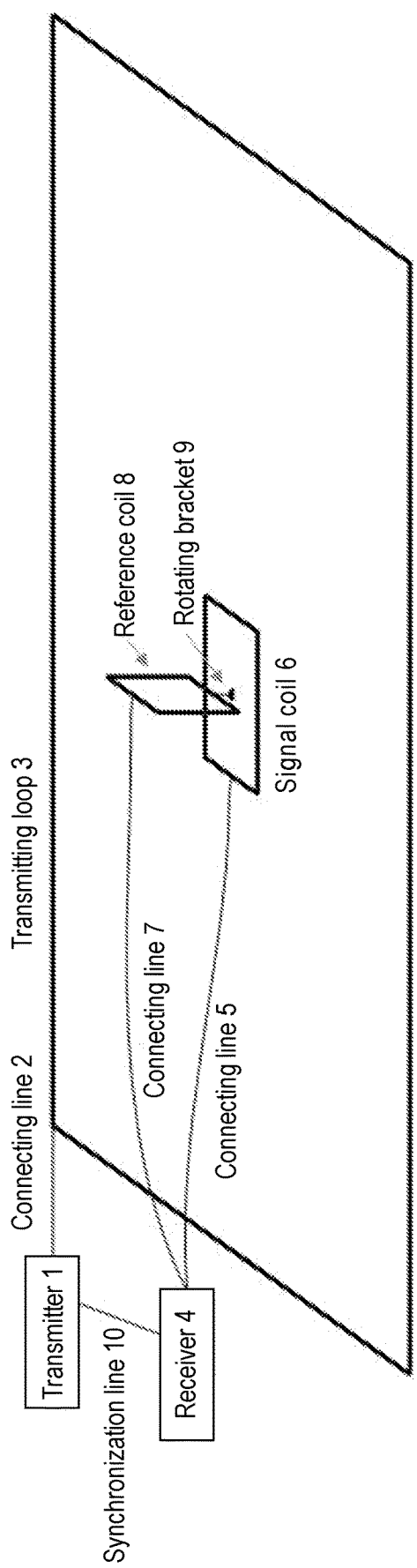
FIG. 1 is a functional block diagram of a reference noise cancellation device for a transient electromagnetic field provided by an embodiment of the present disclosure.

On the one hand, as shown in FIG. 1, the present disclosure provides a reference noise cancellation device for a transient electromagnetic field. The transmitter 1 includes the parts shown in FIG. 2. The function of the transmitter 1 is to generate the measurement timing sequence shown in FIG. 5, and the timing sequence generates a bipolar current waveform, then the generated bipolar current is injected into the transmitting loop 3 through the first connecting line 2. The transmitting loop 3 is a single-turn copper wire square frame, and the size thereof may be 50 m×50 m. The resistance of the transmitting loop 3 is generally about 0.2 ohm. The first connecting line 2 is a two-core copper wire, one end thereof is connected to the transmitter 1, and the other end thereof is connected to the transmitting loop 3. The transmitter 1 is powered by the battery 20, and the generated current is the battery voltage divided by the resistance of the transmitting loop 3. For example, when the voltage of the battery 20 is 12 volt and the resistance of the transmitting loop 3 is 0.2 ohm, the generated current may be 60 amps. The second connecting line 5 and the third connecting line 7 are both shielded twisted paired lines. The second connecting line 5 sends the induced magnetic field of the underground conductor and the surrounding electromagnetic field interference received by the signal coil 6 to the receiver 4. The third connecting line 7 sends the surrounding electromagnetic field interference received by the reference coil 8 to the receiver 4. The measurement timing sequence generated by the timing sequence generator 19 in the transmitter 1 is connected to the receiver 4 through the synchronization line 10 to trigger the receiver 4 to synchronously record the induction signal in the signal coil 6 and the electromagnetic noise in the reference coil 8. Both the signal coil 6 and the reference coil 8 are placed in the center of the transmitting loop 3; the signal coil 6 is placed horizontally, and the reference coil 8 is placed vertically. The signal coil 6 and the reference coil 8 are the same and may be wound with enameled wire. The size thereof may be 1 m×1 m and the number of turns is 20.

Figure 2:
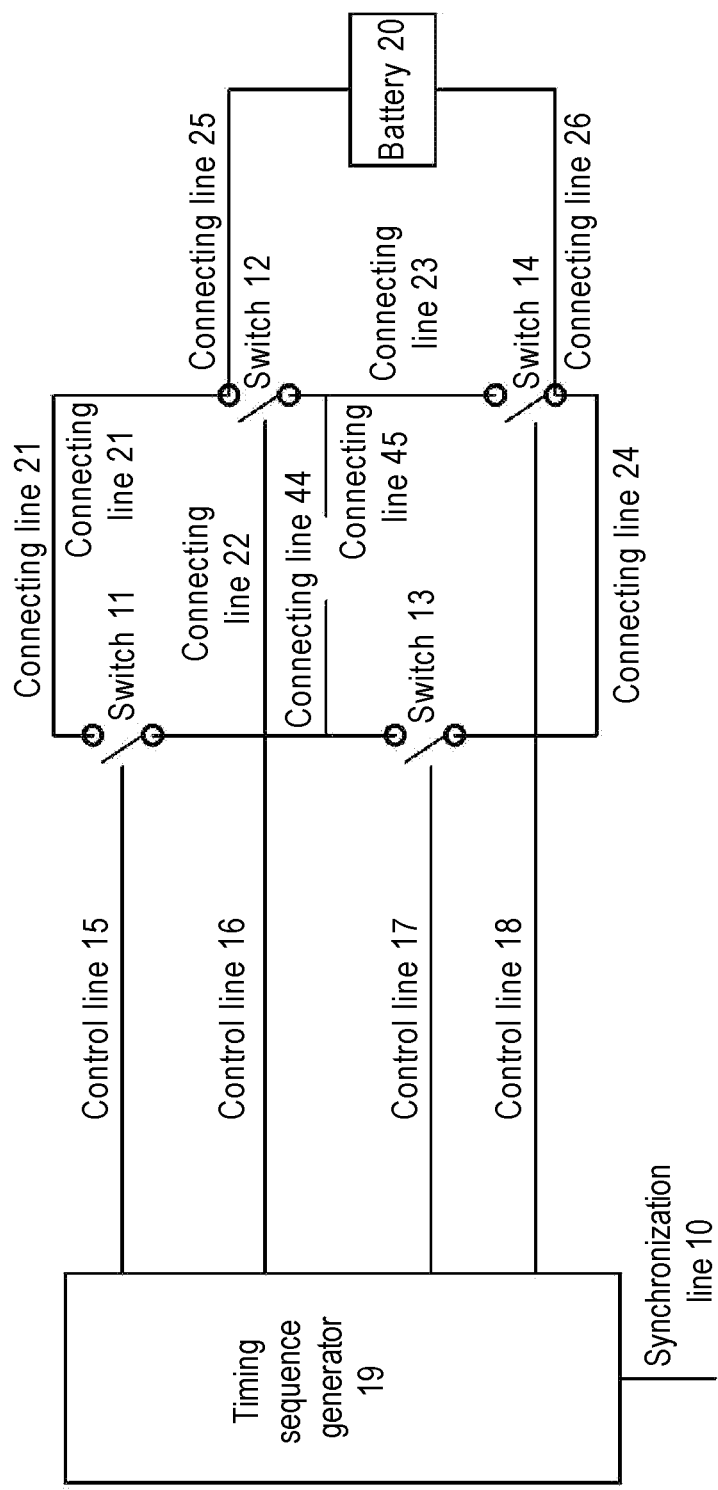
FIG. 2 is a block diagram of a transmitter provided by an embodiment of the present disclosure.

FIG. 2 is a block diagram of the transmitter 1. The timing sequence generator 19 generates timing control signals for controlling the on and off of the first switch 11, the second switch 12, the third switch 13 and the fourth switch 14, and use the synchronization line 10 to trigger the receiver 4 to record the signal coil 6 and the reference coil 8. The timing sequence generator may be implemented by a programmable gate array EP4CGX50, which generates four control signals that respectively control the first switch 11 through the first control line 15, control the second switch 12 through the second control line 16, control the third switch 13 through the third control line 17, and control the fourth switch 14 through the fourth control line 18. The first switch 11, the second switch 12, the third switch 13 and the fourth switch 14 may be implemented using metal oxide semiconductor field effect transistors, such as IXTH94N20X4; the battery 20 is a high-power lithium battery, and a lithium battery with 12V and 50 amp hour capacity may be adopted.

Figure 3:
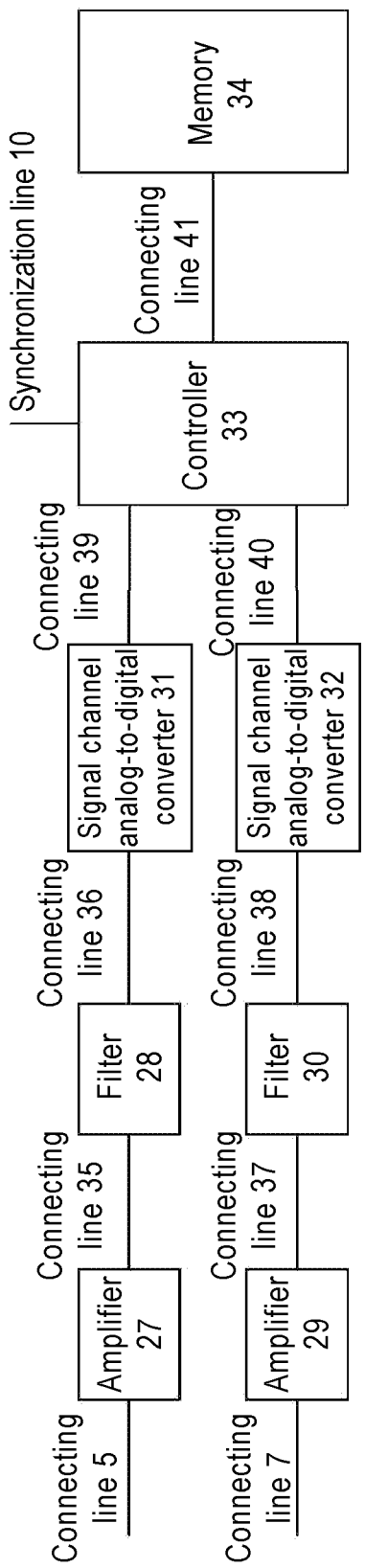
FIG. 3 is a functional block diagram of a receiver provided by an embodiment of the present disclosure.

FIG. 3 is the block diagram showing the principle of the receiver 4. The function of the receiver 4 is to realize synchronous recording of the signal coil 6 and the reference coil 8. The induced magnetic field signal of the underground conductor output by the signal coil 6 and the surrounding electromagnetic field noise are connected to the signal acquisition channel of the receiver 4 through the second connecting line 5, and the amplitude thereof becomes greater through the first amplifier 27 respectively. The first filter 28 filters out high-frequency noise higher than the signal frequency, and then is digitally quantized by the signal channel analog-to-digital converter 31 to obtain the sampling value. The surrounding electromagnetic field noise output from the signal coil 8 is connected to the reference acquisition channel of the receiver 4 through the third connecting line 7, and the amplitude thereof becomes greater through the second amplifier 29 respectively. The second filter 30 filters out high-frequency noise higher than the signal frequency, and then is digitally quantized by the reference channel analog-to-digital converter 32 to obtain the sampling value. The first amplifier 27 and the second amplifier 29 are identical and may be implemented using the operational amplifier AD797. The first filter 28 and the second filter 30 are the same and may be implemented using the operational amplifier AD797 and capacitors and resistors. The signal channel analog-to-digital converter 31 and the reference channel analog-to-digital converter 32 are the same and may be implemented using AD4630-24. The controller 33 is connected to the transmitter 1 through the synchronization line 10. The measurement timing sequence generated by the transmitter 1 is input to the controller 33. The controller 33 triggers the signal channel analog-to-digital converter 31 through the fourteenth connecting line 39, and synchronously triggers the reference channel analog-to-digital converter 32 through the fifteenth connecting line 40. The data converted by the signal channel analog-to-digital converter 31 is read by the controller 33 through the fourteenth connecting line 39, and the data converted by the reference channel analog-to-digital converter 32 is read by the controller 33 through the fifteenth connecting line 40. After the controller 33 reads the data, the read data of the two channels are stored into the memory 34 through the sixteenth connecting line 41 for a subsequent reference denoising. The controller 32 may be implemented with a programmable gate array ZYNQ7000, and the memory 34 may be achieved by solid state drive.

Figure 4:
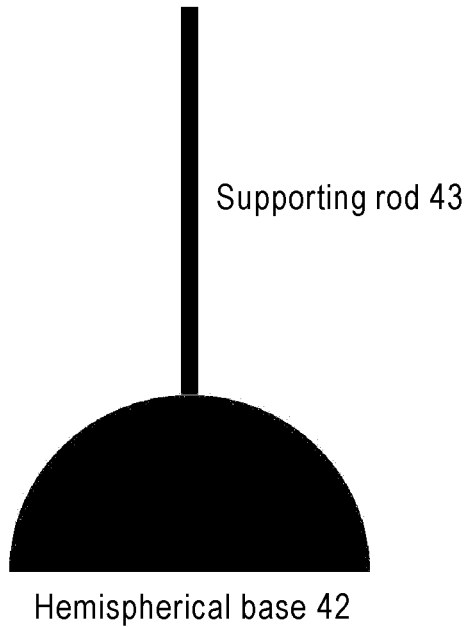
FIG. 4 is a structural diagram of a rotating bracket provided by an embodiment of the present disclosure.

FIG. 4 is a structural diagram of a rotating bracket, which includes a hemispherical base 42 and a support rod 43. The purpose of the rotating bracket is to place the reference coil 8 at an angle perpendicular to the ground. An induced magnetic field signal is generated along a vertical direction for the horizontal layered earth resistivity model, and then the magnetic field signal of the underground conductor is not generated along a horizontal direction. The reference coil 8 is placed vertically, so it is possible to prevent the reference coil 8 from receiving the induced magnetic field signal generated by the underground conductor; the hemispherical base 42 may increase the stability of the placement of the reference coil 8. The rotating bracket 9 may allow the reference coil 8 to rotate about the support rod 43, and the function thereof is to increase the coupling between the electromagnetic field noise and the reference coil 8, so that the reference coil 8 receives stronger electromagnetic field noise.

Figure 5:
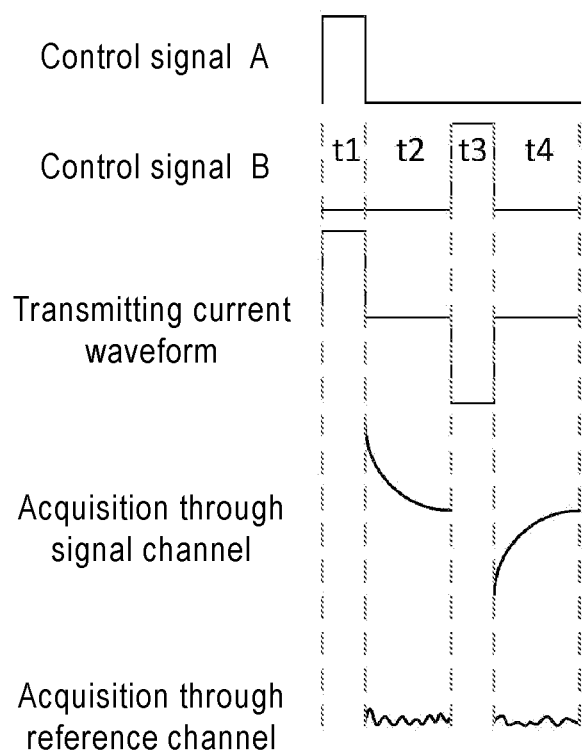
FIG. 5 is a timing sequence diagram of a reference noise cancellation measurement in a transient electromagnetic field provided by an embodiment of the present disclosure.

FIG. 5 is a timing sequence diagram of measurement. The control signal A and control signal B are generated by the timing sequence generator 19 in the transmitter. The first control line 15 and the fourth control line 18 transmit the control signal A, and the second control line 16 and the third control line 17 transmit the control signal B. When the control signal is high level, the switch in the transmitter 1 will be turned on; when the control signal is low level, the switch in the transmitter 1 will be turned off. Therefore, in the control signal shown in FIG. 6, during the period t1, the control signal A is high level and the control signal B is low level. Under the circumstances, the first switch 11 and the fourth switch 14 are turned on, and the second switch 12 and the third switch 13 are turned off. The current in the battery 20 flows into the transmitting loop 3 from left to right through the eighth connecting line 25, the fourth connecting line 21, the first connecting line 2 and the seventeenth connecting line 44, and then flows back to the negative electrode of the battery 20 through the first control line 15, the sixth connecting line 23 and the ninth connecting line 26, thereby generating a forward emission current.

During the period t2, both the control signal A and the control signal B are low level, so the first switch 11, the second switch 12, the third switch 13 and the fourth switch 14 are all turned off. Under the circumstances, the current in the transmitting loop 3 disappear. According to the law of electromagnetic induction, the induced magnetic field signal is not generated in the horizontal direction for the horizontal layered earth resistivity model, and an induced magnetic field signal Hz is generated along the direction perpendicular to the ground.

$$H_Z = \frac{Ia}{2} \int_{-\infty}^{+\infty} \int_0^{\infty} e^{-\lambda h} \frac{z^1}{z^1 + z_0} J_1(\lambda a) J_0(\lambda r) \lambda d\lambda \cdot e^{j\omega t} d\omega$$

In the formula, I is the emission current; a is the radius of the transmitting loop, r is the radius of the receiving loop; $\omega$ is the angular frequency; h is the angle between the receiving coil and the ground; $J_0$ is the zero-order Bessel function; $J_1$ is the first-order inner Serge function; $z^1$ represents the input impedance of the first layer, which is obtained by the following recursive formula:

$$z^i = z_i \frac{z^{i+1} + z_i th(u_i h_i)}{z_i + z^{i+1} th(u_i h_i)}$$

In the formula, $z^i$ is the input impedance of the i-th layer surface; $z^{i+1}$ is the input impedance of the i+1-th layer surface; and $$z_i = -j\omega\mu_0/u_i$$
$$u_i = \sqrt{\lambda^2 + j\omega\sigma_i\mu_0}$$

In the formula, j represents the imaginary unit, $\mu_0$ is the vacuum magnetic permeability, $\lambda$ represents the spatial wave number, and $\sigma_i$ is the conductivity of the i-th layer; when i=0, i represents the air layer; therefore, $$z_0 = -j\omega\mu_0/u_0;$$

The algorithm starts from the base layer (n-th layer) and proceeds upwards one by one to finally obtain $z^1$ of the first layer; $h_i$ represents the thickness of the i-th layer; the induced voltage is generated in the signal coil may be obtained from Faraday's law of electromagnetic induction.

$$s = \mu_0 q \frac{dH}{dt}$$

In the formula, $\mu_0$ represents the vacuum magnetic permeability; q represents the area of the receiving coil; H is the received magnetic field strength; and t is time.

Since the reference coil is placed vertically, in the horizontal layered earth model, there will be no induced magnetic field generated by the underground conductor in the horizontal direction, and only the noise of the surrounding magnetic field will be received; while the signal channel will receive both the induced magnetic field and the surrounding electromagnetic field noise synchronously generated by the underground conductor.

During the period t3, the control signal A is low level and control signal B is high level. Under the circumstances, the second switch 12 and the third switch 13 are turned on, the first switch 11 and the fourth switch 14 are turned off, and the current in the battery 20 flows into the transmitting loop 3 from right to left through the eighth connecting line 45 and the eighteenth connecting line 45, and flows back to the negative electrode of the battery 20 through the seventeenth connecting line 44, the seventh connecting line 24 and the ninth connecting line 26, thereby generating reverse emission current.

During the period t4, both the control signal A and the control signal B are low level, so the first switch 11, the second switch 12, the third switch 13 and the fourth switch 14 are all turned off. Under the circumstances, the current in the transmitting loop 3 disappears. According to the law of electromagnetic induction, the induced magnetic field signal is not generated in the horizontal direction for the horizontal layered earth resistivity model, and an induced magnetic field signal Hz is generated along the direction perpendicular to the ground, but the direction thereof is opposite to the induced magnetic field signal generated in the period t2, and the induced voltage generated is −s.

Figure 6:
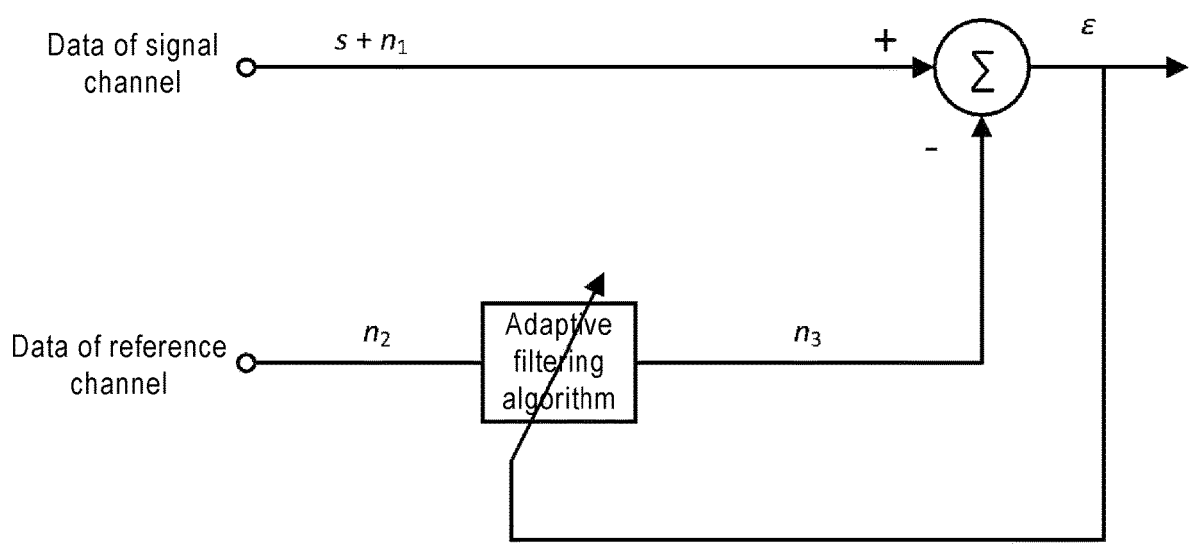
FIG. 6 is a schematic diagram illustrating the principle of reference denoising provided by an embodiment of the present disclosure.

FIG. 6 is a schematic diagram showing the principle of reference denoising. The data collected by the signal channel through the signal coil 6 is the value of the superposition of the underground conductor s and the surrounding electromagnetic noise $n_1$. The reference channel collects the surrounding electromagnetic noise $n_2$ through the reference coil 8. The purpose of reference denoising is to use the adaptive algorithm to convert the surrounding electromagnetic noise $n_2$ collected by the reference coil 8 into the estimate value $\hat{n}_1$ of the surrounding electromagnetic field noise $n_1$ collected by the signal coil 6, and subtract the estimate value $\hat{n}_1$ from the data of the signal channel to obtain the denoised transient electromagnetic field signal s. The adaptive algorithm consists of the following steps:

(i) initializing filter coefficient v(0);
(ii) calculating the autocorrelation matrix R of the reference channel and the cross-correlation matrix p between the two channels;
(iii) adjusting the filter parameters v(k+1)=v(k)+μ[p−Rv(k)] based on the gradient vector; wherein μ represents the step factor and k represents the number of iterations;
(iv) returning to step (ii) to denoise the next piece of data.

Figure 7:
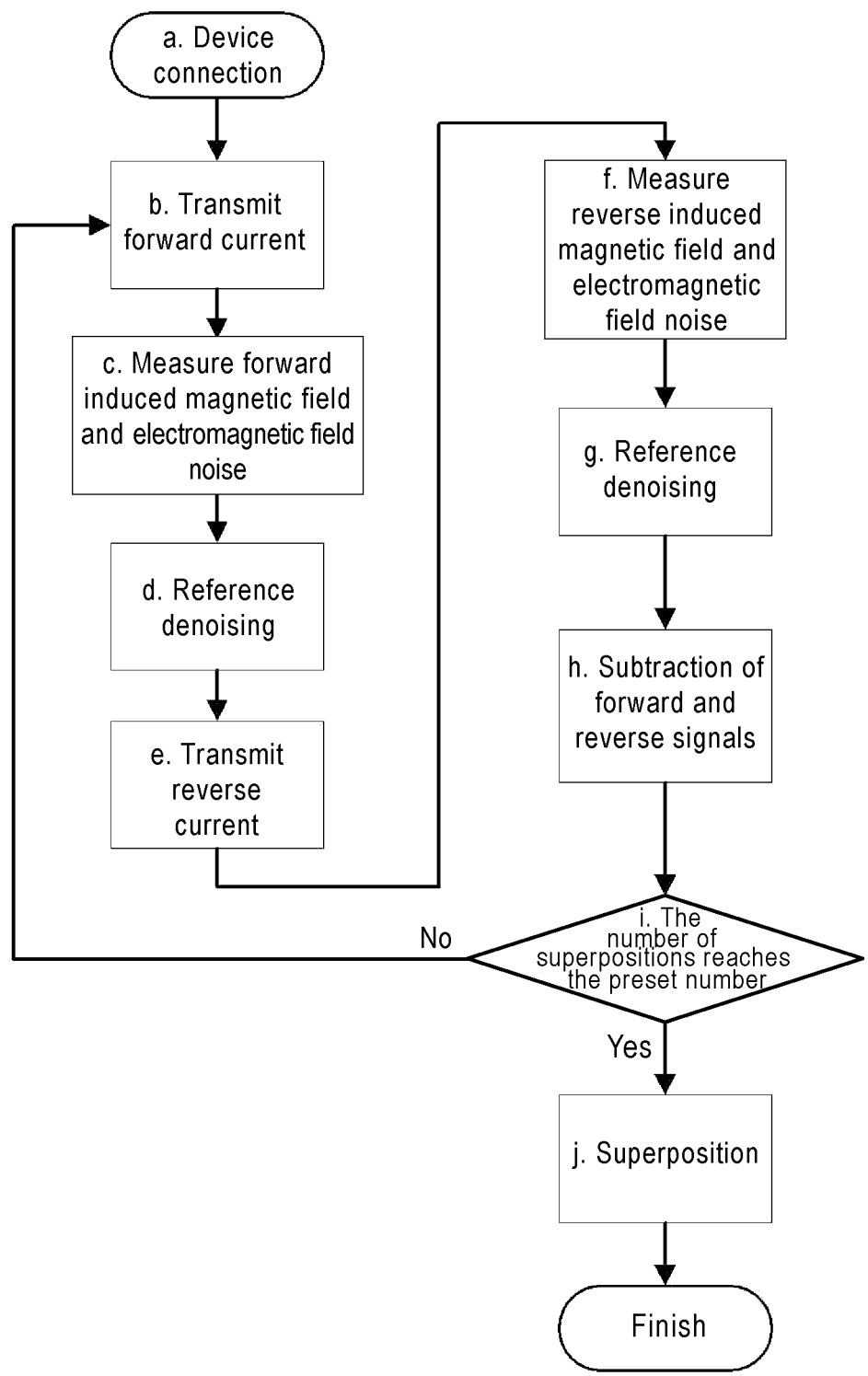
FIG. 7 is a flow chart of reference denoising in a transient electromagnetic field provided by an embodiment of the present disclosure.

FIG. 7 is a flow chart of reference denoising in a transient electromagnetic field, which specifically includes the following steps:

step a: connecting the transmitter 1 to the transmitting loop 3 through the first connecting line 2; connecting the receiver 4 to the signal coil 6 through the second connecting line 5; connecting the receiver 4 to the reference coil 8 through the third connecting line 7; and connecting the transmitter 1 to the receiver 4 through the synchronization line 10;

step b: generating a forward emission current to generate the forward excitation magnetic field by turning on the first switch 11 and the fourth switch 14;

step c: collecting the forward induced magnetic field signal of the underground conductor while completing the recording of the electromagnetic noise in the reference coil;

step d: using the reference noise cancellation algorithm to convert the surrounding electromagnetic field noise recorded by the reference channel into the electromagnetic field noise of the signal channel, and subtracting the electromagnetic field noise from the signal channel to obtain the forward induced magnetic field signal in the signal channel;

step e: generating a reverse excitation magnetic field by turning on the second switch and the third switch;

step f: collecting the reverse induced magnetic field signal of the underground conductor while completing the recording of the electromagnetic noise in the reference coil;

step g: using the reference noise cancellation algorithm to convert the surrounding electromagnetic field noise recorded by the reference channel into the electromagnetic field noise of the signal channel, and subtracting the electromagnetic field noise from the signal channel to obtain the reverse induced magnetic field signal in the signal channel;

step h: subtracting the reverse induced magnetic field signal obtained in step g from the forward induced magnetic field signal obtained in step d to obtain the difference signal between the two to cancel the low-frequency drift noise;

step i: checking whether the number of superpositions is enough; if not, repeating all the processes from step b to step h; if the number of superpositions is enough, go to step j;

step j: superimposing the difference signal of a certain number of observations of the forward observation signal and the reverse observation signal to obtain the mean and variance of multiple observations as the final measurement result.

The disclosure provides a reference noise cancellation device and a reference noise cancellation method for a transient electromagnetic field, which may improve the anti-interference of transient electromagnetic field observation, which not only eliminates the influence of steady-state noise on transient electromagnetic measurements, but also removes unsteady-state noise from the observation channel, thereby improving data quality and detection accuracy of transient electromagnetic field. After the anti-interference of detection of the transient electromagnetic field is improved, the application scope of the method may be expanded to interference environments with strong noise, such as detection in urban underground spaces, advanced detection of water inrush in mines, etc.

It is easy for those skilled in the art to understand that the above descriptions are only preferred embodiments of the present disclosure and are not intended to limit the present disclosure. Any modifications, equivalent substitutions and improvements, etc., made within the spirit and principles of the present disclosure should all be included in the protection scope of the present disclosure.

What is claimed is:

1. A reference noise cancellation device for a transient electromagnetic field, comprising:
   a transmitter, wherein one end of the transmitter is connected to the transmitting loop through a first connecting line;
   a receiver, wherein the other end of the transmitter is connected to the receiver through a synchronization line;
   a signal coil, wherein the signal coil is connected to the receiver through a second connecting line;
   a reference coil, wherein the reference coil is connected to the receiver through a third connecting line; and
   a transmitting loop, wherein the signal coil and the reference coil are located in a center of the transmitting loop;
   wherein the signal coil is placed horizontally, and the reference coil is placed vertically;
   wherein a power supply is configured to supply power to the transmitter;
   wherein the transmitter is configured to generate a measurement timing sequence to trigger the receiver to synchronously record an induction signal in the signal coil and an electromagnetic noise in the reference coil;
   wherein a waveform of a bipolar current is generated and is injected into the transmitting loop through the first connecting line, and a magnitude of the bipolar current is a supply voltage divided by a resistance of the transmitting loop;
   wherein the transmitting loop is configured to excite an underground conductor to generate an induced current and an induced magnetic field;
   wherein the signal coil is configured to receive the induced magnetic field of the underground conductor and a surrounding magnetic field noise;
   wherein the reference coil is configured to receive a surrounding electromagnetic noise;
   wherein the receiver is configured to receive and record the induced magnetic field and the surrounding electromagnetic noise of the underground conductor in the signal coil and the surrounding electromagnetic noise in the reference coil.

2. The reference noise cancellation device for a transient electromagnetic field according to claim 1, wherein the transmitter comprises a timing sequence generator, a first switch, a second switch, a third switch, a fourth switch, the synchronization line, a first control line, a second control line, a third control line and a fourth control line;
   the timing sequence generator is configured to generate a timing sequence control signal to control on and off of the first switch, the second switch, the third switch and the fourth switch respectively through the first control line, the second control line, the third control line and the fourth control line, and use the synchronization line to trigger the receiver to record the signal coil and reference coil.

3. The reference noise cancellation device for a transient electromagnetic field according to claim 2, wherein the receiver comprises a first amplifier, a second amplifier, a first filter, a second filter, a signal channel analog-to-digital converter, a reference channel analog-to-digital converter, a controller and a memory;
   wherein an output end of the first amplifier is connected to an input end of the first filter; an output end of the first filter is connected to an input end of the signal channel analog-to-digital converter; an output end of the signal channel analog-to-digital converter is connected to the controller; an output end of the second amplifier is connected to an input end of the second filter; an output end of the second filter is connected to an input end of the reference channel analog-to-digital converter; an output end of the reference channel analog-to-digital converter is connected to the controller; an output end of the controller is connected to the memory;
   wherein the first amplifier, the first filter and the signal channel analog-to-digital converter are constructed as a signal acquisition channel; the first amplifier is configured to increase an amplitude of an induced magnetic field signal of the underground conductor output by the signal coil and the surrounding electromagnetic noise; the first filter is configured to filter out a high-frequency noise higher than a signal frequency from a signal transmitted by the first amplifier; the signal channel analog-to-digital converter is configured to digitally quantize the signal transmitted by the first amplifier that filters out the high-frequency noise to obtain a first sampling value;
   wherein the second amplifier, the second filter and the reference channel analog-to-digital converter are constructed as a reference acquisition channel; the second amplifier is configured to increase an amplitude of the surrounding electromagnetic noise output by the signal coil; the second filter is configured to filter out the high-frequency noise higher than the signal frequency from the surrounding electromagnetic noise with the increased amplitude; the reference channel analog-to-digital converter is configured to digitally quantize a signal output by the second filter to obtain a second sampling value;
   wherein the controller is configured to read the first sampling value and the second sampling value, and store the first sampling value and the second sampling value in the memory.

4. The reference noise cancellation device for a transient electromagnetic field according to claim 3, wherein a rotating bracket is configured to place the reference coil at an angle perpendicular to a ground, the rotating bracket comprises a hemispherical base and a support rod; the hemispherical base is configured to increase a stability of the reference coil; the support rod is configured to allow the reference coil to rotate about the support rod.

5. The reference noise cancellation device for a transient electromagnetic field according to claim 2, wherein the timing sequence generator generates a control signal A and a control signal B; the first control line and the fourth control line transmit the control signal A, and the second control line and the third control line transmit the control signal B;

wherein during a period t1, when the control signal A is high level and the control signal B is low level, the first switch and the fourth switch are turned on, and the second switch and the third switch are turned off; a current in the power supply passes through an eighth connecting line, a fourth connecting line, a first connecting line and a seventeenth connecting line, and flows into the transmitting loop from left to right, and then flows back to a negative electrode of the power supply through the first control line, a sixth connecting line and a ninth connecting line, thereby generating a forward emission current;

wherein during a period t2, when both the control signal A and the control signal B are low level, the first switch, the second switch, the third switch and the fourth switch are all turned off, and a current in a transmitting loop disappears; according to a law of electromagnetic induction, based on a horizontal layered earth resistivity model, an induced magnetic field signal is not generated in a horizontal direction, and the induced magnetic field signal is generated along a direction perpendicular to a ground;

wherein during a period t3, when the control signal A is low level and control signal B is high level, the second switch and the third switch are turned on, the first switch and the fourth switch are turned off, and the current in the power supply passes through the eighth connecting line and an eighteenth connecting line, and flows into the transmitting loop from right to left, and flows back to the negative electrode of the power supply through the seventeenth connecting line, a seventh connecting line and the ninth connecting line, thereby generating a reverse emission current;

wherein during a period t4, when the control signal A and the control signal B are both low level, the first switch, the second switch, the third switch and the fourth switch are all turned off, and the current in the transmitting loop disappears, according to the law of electromagnetic induction, based on the horizontal layered earth resistivity model, the induced magnetic field signal is not generated in the horizontal direction, and the induced magnetic field signal is generated along the direction perpendicular to the ground, but a direction of the induced magnetic field is opposite to the induced magnetic field signal generated in the period t2.

6. A reference noise cancellation method based on the reference noise cancellation device for a transient electromagnetic field according to claim 2, comprising:

D1: generating the forward emission current to generate the forward excitation magnetic field by turning on the first switch and the fourth switch;

D2: collecting the forward induced magnetic field signal of the underground conductor while completing the recording of the surrounding electromagnetic noise in the reference coil;

D3: using a reference noise cancellation algorithm to convert the surrounding electromagnetic field noise recorded by a reference channel into an estimate value of an electromagnetic noise of a signal channel, and subtracting the estimate value from the signal channel to obtain the forward induced magnetic field signal in the signal channel;

D4: generating the reverse excitation magnetic field by turning on the second switch and the third switch;

D5: collecting the reverse induced magnetic field signal of the underground conductor while completing the recording of the surrounding electromagnetic noise in the reference coil;

D6: using the reference noise cancellation algorithm to convert the surrounding electromagnetic noise recorded by the reference channel into the estimate value of the electromagnetic noise of the signal channel, and subtracting the estimate value from the signal channel to obtain the reverse induced magnetic field signal in the signal channel;

D7: subtracting the reverse induced magnetic field signal obtained in step D6 from the forward induced magnetic field signal obtained in step D3 to obtain a difference signal between the two to cancel a low-frequency drift noise;

D8: determining whether a number of iterations reaches a preset number of iterations, if not, repeating steps D1 to D7, otherwise performing step D9; and D9: superposing a plurality of difference signals obtained through loops to obtain a mean and a variance of the plurality of difference signals.

7. The reference noise cancellation method according to claim 6, wherein the reference noise cancellation algorithm comprises:

the signal channel is adopted to collect a superposition value of the induced magnetic field of the underground conductor and the surrounding electromagnetic noise through the signal coil;

the reference channel is adopted to collect the surrounding electromagnetic noise through the reference coil;

the adaptive algorithm is adopted to convert the surrounding electromagnetic noise collected by the reference coil into the estimate value of the surrounding electromagnetic noise collected by the signal coil;

the estimate value of the surrounding electromagnetic noise collected by the signal coil is subtracted from the superposition value of the induced magnetic field of the underground conductor collected by the signal channel and the surrounding electromagnetic noise to obtain a denoised transient electromagnetic signal.

* * * * *